(12) United States Patent
Afridi et al.

(10) Patent No.: US 12,294,225 B2
(45) Date of Patent: May 6, 2025

(54) ROADWAY EMBEDDABLE CAPACITIVE WIRELESS CHARGING SYSTEMS

(71) Applicant: CORNELL UNIVERSITY, Ithaca, NY (US)

(72) Inventors: Khurram Afridi, Ithaca, NY (US);
Sounak Maji, Ithaca, NY (US);
Sreyam Sinha, Ithaca, NY (US);
Brandon Regensburger, Ithaca, NY (US)

(73) Assignee: Cornell University, Ithaca, NY (US)

(*) Notice: Subject to any disclaimer, the term of this patent is extended or adjusted under 35 U.S.C. 154(b) by 596 days.

(21) Appl. No.: 17/666,270

(22) Filed: Feb. 7, 2022

(65) Prior Publication Data

US 2022/0255348 A1 Aug. 11, 2022

Related U.S. Application Data

(60) Provisional application No. 63/209,954, filed on Jun. 11, 2021, provisional application No. 63/146,615, filed on Feb. 6, 2021.

(51) Int. Cl.
*H02J 50/05* (2016.01)
*B60L 53/10* (2019.01)
(Continued)

(52) U.S. Cl.
CPC .............. *H02J 50/05* (2016.02); *B60L 53/10* (2019.02); *B60L 53/32* (2019.02); *E01F 11/00* (2013.01);
(Continued)

(58) Field of Classification Search
CPC ........ H02J 50/05; H02J 50/005; H02J 50/402; H02J 2310/48; B60L 53/10; B60L 53/32;
(Continued)

(56) References Cited

U.S. PATENT DOCUMENTS

| 10,291,080 B2* | 5/2019 | Yamamoto | H02J 50/05 |
| 10,298,057 B2* | 5/2019 | Mi | H02J 50/90 |

(Continued)

FOREIGN PATENT DOCUMENTS

| CN | 109606147 A | 4/2019 |
| DE | 102017205229 A1 | 10/2018 |

OTHER PUBLICATIONS

Zhang, Hua, An Electric Roadway System Leveraging Dynamic Capacitive Wireless Charging, IEEE Electrification Magazine, Jun. 2020, 9 pages.

(Continued)

*Primary Examiner* — M Baye Diao
(74) *Attorney, Agent, or Firm* — Barnes & Thornburg

(57) ABSTRACT

A capacitive wireless charging system for use with a vehicle includes a roadway-side capacitive charging pad configured to be embedded in a roadway and to form a capacitive electrical connection with a vehicle-side capacitive charging pad for wirelessly transferring power to charge a vehicle battery when the vehicle is on the roadway, a power conditioning circuit configured to be positioned next to the roadway and to condition power received from a power source, and a plurality of conductors configured to be at least partially embedded in the roadway and to electrically connect the power conditioning circuit and the roadway-side capacitive charging pad, such that the plurality of conductors form a roadway-side matching network for the capacitive electrical connection without discrete inductors and capacitors.

21 Claims, 9 Drawing Sheets

(51) Int. Cl.
| | |
|---|---|
| B60L 53/30 | (2019.01) |
| E01F 11/00 | (2006.01) |
| H02J 50/00 | (2016.01) |
| H02J 50/40 | (2016.01) |
| H03J 3/20 | (2006.01) |

(52) U.S. Cl.
CPC .......... *H02J 50/005* (2020.01); *H02J 50/402* (2020.01); *H03J 3/20* (2013.01); *H02J 2310/48* (2020.01)

(58) Field of Classification Search
CPC ...... B60L 2260/32; B60L 50/53; B60L 5/005; E01F 11/00; H03J 3/20
USPC .......................................................... 320/109
See application file for complete search history.

(56) References Cited

U.S. PATENT DOCUMENTS

| | | | | |
|---|---|---|---|---|
| 10,298,058 | B2* | 5/2019 | Afridi | B60L 53/57 |
| 10,449,865 | B2 | 10/2019 | Rumbak | |
| 10,513,190 | B2 | 12/2019 | Huang et al. | |
| 10,965,156 | B2 | 3/2021 | Peretz et al. | |
| 11,101,693 | B2 | 8/2021 | Khalilinia | |
| 11,171,511 | B2* | 11/2021 | Afridi | H04B 5/22 |
| 11,228,204 | B2 | 1/2022 | Mi et al. | |
| 11,354,560 | B2* | 6/2022 | Lotya | H04B 5/24 |
| 11,418,165 | B2* | 8/2022 | Afridi | H03H 7/38 |
| 11,651,891 | B2* | 5/2023 | Boys | B60L 53/12 |
| | | | | 191/10 |
| 11,756,727 | B2* | 9/2023 | Covic | H02J 50/402 |
| | | | | 307/104 |
| 2013/0229061 | A1* | 9/2013 | Budhia | H01F 38/14 |
| | | | | 307/104 |
| 2013/0234530 | A1 | 9/2013 | Miyauchi | |
| 2016/0294217 | A1* | 10/2016 | Mi | H02J 50/05 |
| 2018/0278097 | A1* | 9/2018 | Yamamoto | H02J 50/05 |
| 2019/0207420 | A1* | 7/2019 | Afridi | H02J 50/70 |
| 2019/0319600 | A1* | 10/2019 | Afridi | H01F 27/2823 |
| 2020/0373783 | A1 | 11/2020 | Afridi et al. | |
| 2023/0253947 | A1* | 8/2023 | Afridi | H01F 27/2823 |
| | | | | 307/9.1 |

OTHER PUBLICATIONS

Regensburger, Brandon et al., High-Performance Large Air-Gap Capacitive Wireless Power Transfer System for Electric Vehicle Charing, Department of Electrical, Computer, and Energy Engineering University of Colorado Boulder, 2017, 6 pages.

Kumar, Ashish et al., Investigation of Power Transfer Density Enhancement in Large Air-Gap Capacitive Wireless Power Transfer Systems, University of Colorado Boulder, 2015, 4 pages.
Halan, Deepak, Wireless Charging of Electric Cars: Close to Reality, electronicsforu.com, May 24, 2021, 14 pages.
Maji, Sounak, A Large Air-Gap Multi-MHz Capacitive Wireless Power Transfer System Using Compact Charging Pads, IEEE Xplore, Jun. 14, 2021, 7 pages.
Maji, Sounak, Roadway Embeddable Multi-MHz Capacitive Wireless Charging System with Matching Network Realized using Wiring Parasitics, IEEE Xplore, Oct. 14, 2021, 6 pages.
Sinha, Sreyam et al., A Multi-MHz Large Air-gap Capacitive Wireless Power Transfer System Utilizing an Active Variable Reactance Rectifier Suitable for Dynamic Electric Vehicle Charging, Department of Electrical and Computer Engineering Cornell University, 2019, 7 pages.
R&D Cleveland: WTWH Media LLC, Future Electric Cars Could Recharge Wirelessly While You Drive, Mar. 27, 208, 2 pages.
Soares, Laura et al., A Study on Renewed Perspectives of Electrified Road for Wireless Power Transfer of Electric Vehicles, www.elsevier.com, Jan. 15, 2022, 11 pages.
Keebler, Jack, Cornell Researchers Work on a Way to Charge EVs as They Travel Down the Road, Automotive News, Jul. 18, 2021, 3 pages.
Panchal, Chirag et al., Review of Static And Dynamic Wireless Electric Vehicle Charging System, Engineering Science and Technology Journal, Jun. 27, 2018, 16 pages.
Lu, Fei, High Power Capacitive Power Transfer for Electric Vehicle Charging Applications, The University of Michigan, 2017, 152 pages.
Regensburger, Brandon Ray, Capacitive Wireless Power Transfer Systems for Electric Vehicle Charging, a Dissertation Presented to the Faculty of the Graduate School of Cornell University, Dec. 2020, 94 pages.
Sinha, Sreyam et al., A New Design Approach to Mitigating the Effect of Parasitics in Capacitive Wireless Power Transfer Systems for Electric Vehicle Charging, IEEE Transactions on Transportation Electrification, Dec. 2019, 20 pages.
Kumar, Ashish et al., Improved Design Optimization for High-Efficiency Matching Networks, IEEE Transactions on Power Electronics, Jan. 2018, 14 pages.
Sinha, Sreyam et al., Active Variable Reactance Rectifier—A New Approach to Compensating for Coupling Variations in Wireless Power Transfer Systems, IEEE Journal of Emerging and Selected Topics in Power Electronics, Sep. 2020, 19 pages.
Sinha, Sreyam et al., Closed-loop Control of a Dynamic Capacitive Wireless Power Transfer System, Department of Electrical and Computer Engineering Cornell University, 2019, 6 pages.
Afridi, Khurram, Wireless Charging of Electric Vehicles, ElectronicDesign.com, Feb. 7, 2018, 17 pages.

* cited by examiner

ROADWAY EMBEDDABLE CAPACITIVE WIRELESS CHARGING SYSTEMS

CROSS-REFERENCE TO RELATED APPLICATIONS

This application claims priority to and the benefit of U.S. Provisional Application 63/146,615, filed Feb. 6, 2021, and U.S. Provisional Application 63/209,954, filed Jun. 11, 2021. The entire disclosures of these applications are incorporated herein by reference.

TECHNICAL FIELD

The present disclosure relates generally to systems for wireless charging and, more particularly, to roadway embeddable capacitive wireless charging systems.

BACKGROUND

Wireless power transfer (WPT) systems can potentially increase adoption of electric vehicles by helping overcome their cost, charging time, and range limitations. However, many prior art WPT systems utilize magnetic fields between inductively coupled coils to transfer power from the ground to the vehicle. These systems typically use heavy, bulky, and fragile ferrites for flux guidance, making the charging pads difficult to embed in the roadway. Additionally, large high-frequency losses in ferrites of some inductive wireless power transfer systems may limit operating frequency of those inductive wireless power transfer systems, as well as limit the ability to reduce the size of those inductive wireless power transfer system while maintaining a predefined power transfer level.

SUMMARY

According to one aspect of the present disclosure, a capacitive wireless charging system for a roadway includes a vehicle including a vehicle-side charging circuit configured to wirelessly receive power to charge a vehicle battery when the vehicle is on the roadway, the vehicle-side charging circuit having a rectifier electrically connected to the vehicle battery, a vehicle-side capacitive charging pad, and a vehicle-side matching network electrically connecting the rectifier and the vehicle-side capacitive charging pad. The capacitive wireless charging system further includes a roadway-side capacitive charging pad embedded in the roadway and configured to form a capacitive electrical connection with the vehicle-side capacitive charging pad for wirelessly transferring power. The capacitive wireless charging system further includes a power conditioning circuit positioned next to the roadway and configured to condition power received from a power source. The capacitive wireless charging system further includes a plurality of conductors at least partially embedded in the roadway and electrically connecting the power conditioning circuit and the roadway-side capacitive charging pad, wherein the plurality of conductors form a roadway-side matching network, and wherein the roadway-side and vehicle-side matching networks together fully compensate for a reactance of the capacitive electrical connection during power transfer across the capacitive electrical connection.

The capacitive wireless charging system may be such that an impedance seen by the power conditioning circuit at its connection to the plurality of conductors is near resistive during power transfer across the capacitive electrical connection.

The capacitive wireless charging system may be such that the roadway-side matching network does not include any discrete inductors or capacitors.

The capacitive wireless charging system may be such that the plurality of conductors comprises a pair of conductors arranged in spaced apart relation with a gap of a predetermined size between the pair of conductors.

The capacitive wireless charging system may be such that the predetermined size of the gap is defined according to a multistage L-section network model based, at least, on dimensions of the pair of conductors, on a permissivity of material disposed in the gap between the pair of conductors, and on a frequency of the conditioned power supplied by the power conditioning circuit to the pair of conductors.

The capacitive wireless charging system may be such that the roadway-side capacitive charging pad includes a pair of laterally-spaced capacitive plates each electrically connected to one of the pair of conductors, a rigid metal sheet arranged below the pair of capacitive plates to electromagnetically shield the pair of capacitive plates from surrounding dissipative materials, and a first insulation layer that separates the pair of capacitive plates from the rigid metal sheet.

The capacitive wireless charging system may be such that the first insulation layer includes Teflon.

The capacitive wireless charging system may be such that the rigid metal sheet is formed to include at least one cut-out arranged beneath a first capacitive plate of the pair of capacitive plates to decrease a capacitance between the first capacitive plate and the rigid metal sheet.

The capacitive wireless charging system may be such that the rigid metal sheet is further formed to include at least one cut-out arranged beneath a second capacitive plate of the pair of capacitive plates to decrease a capacitance between the second capacitive plate and the rigid metal sheet.

The capacitive wireless charging system may be such that the roadway-side capacitive charging pad includes a second insulation layer that overlies the pair of capacitive plates.

The capacitive wireless charging system may be such that the roadway-side capacitive charging pad includes a third insulation layer that fills a space between the pair of laterally-spaced capacitive plates and that extends between the first and second insulation layers.

The capacitive wireless charging system may be such that the vehicle comprises an unmanned vehicle, a robot, or a terrestrial drone.

According to another aspect of the present disclosure, a capacitive wireless charging system for use with a vehicle includes a roadway-side capacitive charging pad configured to be embedded in a roadway and to form a capacitive electrical connection with a vehicle-side capacitive charging pad for wirelessly transferring power to charge a vehicle battery when the vehicle is on the roadway, a power conditioning circuit configured to be positioned next to the roadway and to condition power received from a power source, and a plurality of conductors configured to be at least partially embedded in the roadway and to electrically connect the power conditioning circuit and the roadway-side capacitive charging pad, such that the plurality of conductors form a roadway-side matching network for the capacitive electrical connection without discrete inductors and capacitors.

The capacitive wireless charging system may be such that an impedance seen by the power conditioning circuit at its connection to the plurality of conductors is near resistive during power transfer across the capacitive electrical connection.

The capacitive wireless charging system may be such that the roadway-side matching network is configured to cooperate with a vehicle-side matching network such that the roadway-side and vehicle-side matching networks together fully compensate for a reactance of the capacitive electrical connection during power transfer across the capacitive electrical connection.

The capacitive wireless charging system may be such that the roadway-side capacitive charging pad includes a pair of laterally-spaced capacitive plates each electrically connected to one of the pair of conductors, a rigid metal sheet arranged below the pair of capacitive plates to electromagnetically shield the pair of capacitive plates from surrounding dissipative materials, and a first insulation layer that separates the pair of capacitive plates from the rigid metal sheet.

The capacitive wireless charging system may be such that the rigid metal sheet is formed to include at least one cut-out arranged beneath each plate of the pair of capacitive plates to decrease a capacitance between the pair of capacitive plates and the rigid metal sheet.

According to yet another aspect of the present disclosure, a capacitive wireless charging system for a vehicle includes a rectifier electrically connected to a vehicle electrical power system. The capacitive wireless charging system further includes a vehicle capacitive charging pad configured to form a capacitive electrical connection with a roadway-integrated capacitive charging pad for wirelessly receiving power. The capacitive wireless charging system further includes a vehicle matching network electrically connecting the vehicle capacitive charging pad to the rectifier, wherein the vehicle matching network is configured to cooperate with a roadway-integrated matching network electrically connected to the roadway-integrated capacitive charging pad such that the vehicle and roadway-integrated matching networks together fully compensate for a reactance of the capacitive electrical connection during power transfer across the capacitive electrical connection.

The capacitive wireless charging system may be such that the vehicle matching network comprises a Toroidal-Interleaved-Foil inductor.

According to still another aspect of the present disclosure, a capacitive wireless charging system for a roadway includes a transportation vehicle including a vehicle-side charging module configured to wirelessly receive power to charge a vehicle battery, the vehicle-side charging module having a rectifier electrically coupled to the vehicle battery, a vehicle-side capacitor charging pad, and a vehicle-side compensation network electrically interconnecting the rectifier and the vehicle-side capacitor charging pad. The capacitive wireless charging system further includes a roadway-integrated charging module including curbside power electronics configured to invert grid power, a road-side capacitor charging pad embedded in the roadway and configured to form a capacitive coupling with the vehicle-side capacitor charging pad for wirelessly transferring energy to charge the vehicle battery when the vehicle is arranged over the roadway-integrated charging module, power transmission conductors that electrically connect the curbside power electronics to the road-side capacitor charging pad, and a road-side compensation network matched to the vehicle-side compensation network to provide means for compensating for reactance of the capacitive coupling between the vehicle-side capacitor charging pad and the road-side capacitor charging pad to ensure impedance seen by the power electronics approaches a resistive value during power transmission across the capacitive coupling, where the road-side compensation network is provided by a configuration of the road-side capacitor charging pad and the power transmission conductors without discrete inductors and capacitors.

The capacitive wireless charging system may be such that the power transmission conductors are arranged one on top of the other in spaced apart relation so as to create a gap of a predetermined size therebetween.

The capacitive wireless charging system may be such that the predetermined size of the gap is defined according to a multistage L-section network model based, at least in part, on length of the conductors and permissivity of material between the conductors.

The capacitive wireless charging system may be such that the multistage L-section network model is based, at least in part, on operating frequency of the system.

The capacitive wireless charging system may be such that the road-side capacitor charging pad includes a pair of capacitor coupling plates, each coupled to one of the power transmission conductors, a rigid metal sheet arranged to underlie the pair of capacitor coupling plates to electromagnetically shield the pair of capacitor coupling plates from surrounding dissipative materials, and a first insulation layer that separates the pair of capacitor coupling plates from the rigid metal sheet.

The capacitive wireless charging system may be such that the pair of capacitor coupling plates are spaced laterally from one another by a lateral separation distance.

The capacitive wireless charging system may be such that a thickness of the first insulation layer is sized to drive a desired capacitance between the pair of capacitor coupling plates and the rigid metal sheet such that the desired capacitance and impedance from the power transmission conductors contribute to matching the electrical effect of the road-side compensation network to the vehicle-side compensation network.

The capacitive wireless charging system may be such that the first insulation layer comprises Teflon.

The capacitive wireless charging system may be such that the rigid metal sheet is formed to include at least one cut-out or opening arranged beneath at least one of the pair of capacitor coupling plates to decrease a capacitance between the pair of capacitor coupling plates and the rigid metal sheet.

The capacitive wireless charging system may be such that the rigid metal sheet is formed to include a plurality of cut-outs or openings arranged beneath one or, or both of, the capacitor coupling plates.

The capacitive wireless charging system may be such that the road-side capacitor charging pad includes a second insulation layer with a preselected thickness that overlies the pair of capacitor coupling plates.

The capacitive wireless charging system may be such that the pair of capacitor coupling plates are spaced apart a preselected distance, and wherein the road-side capacitor charging pad includes a third insulation layer that fills the space between the capacitor coupling plates and that extends between the first insulation layer and the second insulation layer.

According to yet another aspect of the present disclosure, a roadway-integrated charging module for use with a transportation vehicle includes power electronics configured to invert grid power, a road-side capacitor charging pad integrated in a roadway and configured to form a capacitive electrical connection with a preselected vehicle-side capacitor charging pad for wirelessly charging a battery of the vehicle when the vehicle is arranged over the roadway-integrated charging module, and a road-side compensation network electrically interconnecting the power electronics and the road-side capacitor charging pad, where the road-side compensation network is matched to the preselected vehicle-side compensation network without discrete inductors and capacitors.

The roadway-integrated charging module may be such that the road-side compensation network is provided, at least in part, by arrangement of power transmission conductors that electrically connect the curbside power electronics to the road-side capacitor charging pad.

The roadway-integrated charging module may be such that the power transmission wires are arranged in spaced apart relation so as to create a gap with a predetermined size therebetween.

The roadway-integrated charging module may be such that the predetermined size of the gap is defined according to a multistage L-section network model based, at least in part, on the length of the wire and permissivity of material between the two wires.

The roadway-integrated charging module may be such that the multistage L-section network model is based, at least in part, on the systems operating frequency.

The roadway-integrated charging module may be such that the road-side compensation network is provided, at least in part, by the configuration of the road-side capacitor charging pad, and wherein the road-side capacitor charging pad includes a pair of capacitor coupling plates each coupled to one of the power transmission conductors, a rigid metal sheet arranged to underlie the pair of capacitor coupling plates electromagnetically shielding the pair of capacitor coupling plates from surrounding dissipative materials, and a first insulation layer with a preselected thickness that separates the pair of capacitor coupling plates from the rigid metal sheet.

The roadway-integrated charging module may be such that the preselected thickness of the first insulation layer is sized to drive a desired capacitance between the pair of capacitor coupling plates and the rigid metal sheet such that the desired capacitance and impedance from the power transmission conductors contribute to matching the electrical effect of the road-side compensation network to the vehicle-side compensation network.

The roadway-integrated charging module may be such that the rigid metal sheet is formed to include at least one cut-out arranged beneath the pair of capacitor coupling plates of a preselected size that cooperate with the preselected thickness of the first insulation layer to drive a desired capacitance between the pair of capacitor coupling plates and the rigid metal sheet such that the desired capacitance and impedance from the power transmission conductors contribute to matching the electrical effect of the road-side compensation network to the vehicle-side compensation network.

The roadway-integrated charging module may be such that the road-side capacitor charging pad includes a second insulation layer with a preselected thickness that overlies the pair of capacitor coupling plates.

The roadway-integrated charging module may be such that wherein the pair of capacitor coupling plates are spaced apart a preselected distance, and wherein the road-side capacitor charging pad includes a third insulation layer that fills the space between the capacitor coupling plates and that extends between the first insulation layer and the second insulation layer.

According to still another aspect of the present disclosure, a capacitive wireless charging system for a floor includes a transportation vehicle including a vehicle-side charging module configured to wirelessly receive power to charge a vehicle battery, the vehicle-side charging module having a rectifier electrically coupled to the vehicle battery, a vehicle-side capacitor charging pad, and a vehicle-side compensation network electrically interconnecting the rectifier and the vehicle-side capacitor charging pad. The capacitive wireless charging system further includes a floor-integrated charging module including power delivery circuit configured to invert grid power, a floor-side capacitor charging pad embedded in the floor and configured to form a capacitive electrical connection with the vehicle-side capacitor charging pad for wirelessly transferring energy to charge the battery when the vehicle is arranged over the floor-integrated charging module, power transmission conductors that electrically connect the power delivery circuit to the floor-side capacitor charging pad, and a floor-side compensation network matched to the vehicle-side compensation network to provide means for compensating for the reactance of capacitive coupling between the vehicle-side capacitor charging pad and the floor-side capacitor charging pad to ensure impedance seen by the inverter is near resistive upon power transmission across the capacitive electrical connection, where the floor-side compensation network provided by the configuration of the floor-side capacitor charging pad and the power transmission conductors without discrete inductors and capacitors.

The capacitive wireless charging system may be such that the power transmission conductors are arranged one on top of the other in spaced apart relation so as to create a gap of predetermined size therebetween.

The capacitive wireless charging system may be such that the predetermined size of the gap is defined according to a multistage L-section network model based, at least in part, on the length of the wire and permissivity of material between the two wires.

The capacitive wireless charging system may be such that the multistage L-section network model is based, at least in part, on the systems operating frequency.

The capacitive wireless charging system may be such that the floor-side capacitor charging pad includes a pair of capacitor coupling plates each coupled to one of the power transmission conductors, a rigid metal sheet arranged to underlie the pair of capacitor coupling plates to electromagnetically shield the pair of capacitor coupling plates from surrounding dissipative materials, and a first insulation layer with a preselected thickness that separates the pair of capacitor coupling plates from the rigid metal sheet.

The capacitive wireless charging system may be such that the pair of capacitor coupling plates are spaced laterally from one another by a lateral separation distance.

The capacitive wireless charging system may be such that the preselected thickness of the first insulation layer is sized to drive a desired capacitance between the pair of capacitor coupling plates and the rigid metal sheet such that the desired capacitance and impedance from the power transmission conductors contribute to matching the electrical effect of the floor-side compensation network to the vehicle-side compensation network.

The capacitive wireless charging system may be such that the first insulation layer comprises Teflon.

The capacitive wireless charging system may be such that the rigid metal sheet is formed to include at least one cut-out or opening arranged beneath at least one of the pair of capacitor coupling plates to decrease a capacitance between the pair of capacitor coupling plates and the rigid metal sheet.

The capacitive wireless charging system may be such that the rigid metal sheet is formed to include plurality of cut-outs or openings arranged beneath one or, or both of, the capacitor coupling plates.

The capacitive wireless charging system may be such that the floor-side capacitor charging pad includes a second insulation layer with a preselected thickness that overlies the pair of capacitor coupling plates.

The capacitive wireless charging system may be such that the pair of capacitor coupling plates are spaced apart a preselected distance, and wherein the floor-side capacitor charging pad includes a third insulation layer that fills the space between the capacitor coupling plates and that extends between the first insulation layer and the second insulation layer.

The capacitive wireless charging system may be such that the vehicle comprises an unmanned vehicle, a robot, or a terrestrial drone.

According to yet another aspect of the present disclosure, a floor-integrated charging module for use with an over-the-floor vehicle includes power electronics configured to invert grid power, a floor-side capacitor charging pad integrated in a floor and configured to form a capacitive electrical connection with a vehicle-side capacitor charging pad to wirelessly charge a battery included in the over-the-floor vehicle when the over-the-floor vehicle is arranged over the floor-integrated charging module, and a floor-side compensation network electrically interconnecting the power electronics and the floor-side capacitor charging pad, where the floor-side compensation network is matched to the preselected vehicle-side compensation network without discrete inductors and capacitors.

The floor-integrated charging module may be such that the floor-side compensation network is provided, at least in part, by arrangement of power transmission conductors that electrically connect the power delivery circuit to the floor-side capacitor charging pad.

The floor-integrated charging module may be such that the power transmission wires are arranged in spaced apart relation so as to create a gap with a predetermined size therebetween.

The floor-integrated charging module may be such that the predetermined size of the gap is defined according to a multistage L-section network model based, at least in part, on the length of the wire and permissivity of material between the two wires.

The floor-integrated charging module may be such that the multistage L-section network model is based, at least in part, on operating frequency of the system.

The floor-integrated charging module may be such that the floor-side compensation network is provided, at least in part, by the configuration of the floor-side capacitor charging pad, and wherein the floor-side capacitor charging pad includes a pair of capacitor coupling plates each coupled to one of the power transmission conductors, a rigid metal sheet arranged to underlie the pair of capacitor coupling plates electromagnetically shielding the pair of capacitor coupling plates from surrounding dissipative materials, and a first insulation layer that separates the pair of capacitor coupling plates from the rigid metal sheet.

The floor-integrated charging module may be such that a thickness of the first insulation layer is sized to drive a desired capacitance between the pair of capacitor coupling plates and the rigid metal sheet such that the desired capacitance and impedance from the power transmission conductors contribute to matching the electrical effect of the floor-side compensation network to the vehicle-side compensation network.

The floor-integrated charging module may be such that the rigid metal sheet is formed to include at least one cut-out arranged beneath the pair of capacitor coupling plates of a preselected size that cooperate with the preselected thickness of the first insulation layer to drive a desired capacitance between the pair of capacitor coupling plates and the rigid metal sheet such that the desired capacitance and impedance from the power transmission conductors contribute to matching the electrical effect of the floor-side compensation network to the vehicle-side compensation network.

The floor-integrated charging module may be such that the floor-side capacitor charging pad includes a second insulation layer with a preselected thickness that overlies the pair of capacitor coupling plates.

The floor-integrated charging module may be such that the pair of capacitor coupling plates are spaced apart a preselected distance, and wherein the floor-side capacitor charging pad includes a third insulation layer that fills the space between the capacitor coupling plates and that extends between the first insulation layer and the second insulation layer.

According to still another aspect of the present disclosure, a vehicle-side charging system includes a rectifier electrically coupled to a vehicle electrical power system, and a vehicle-side matching network comprising a vehicle capacitor charging pad disposed at or near a bottom portion of the vehicle and a compensation network electrically interconnecting the rectifier and the vehicle capacitor charging pad, where the vehicle capacitor charging pad is matched to a roadway-integrated capacitor charging pad system and configured to electrically connect to and receive power from the roadway-integrated capacitor charging pad system, where an impedance detected by an inverter of the roadway-integrated capacitor charging pad system approaches a resistive value during power transmission across an electrical connection between the vehicle capacitor charging pad and the roadway-integrated capacitor charging pad system.

The vehicle-side charging system may be such that the vehicle capacitor charging pad comprises a first capacitor coupling plate and a second capacitor coupling plate, the first capacitor coupling plate being spaced from the second capacitor coupling plate by a lateral separation distance.

The vehicle-side charging system may be such that the vehicle-side matching network comprises a Toroidal Interleaved-Foil inductor.

BRIEF DESCRIPTION OF THE DRAWINGS

The detailed description particularly refers to the following figures, in which.

DETAILED DESCRIPTION

Figure 1:
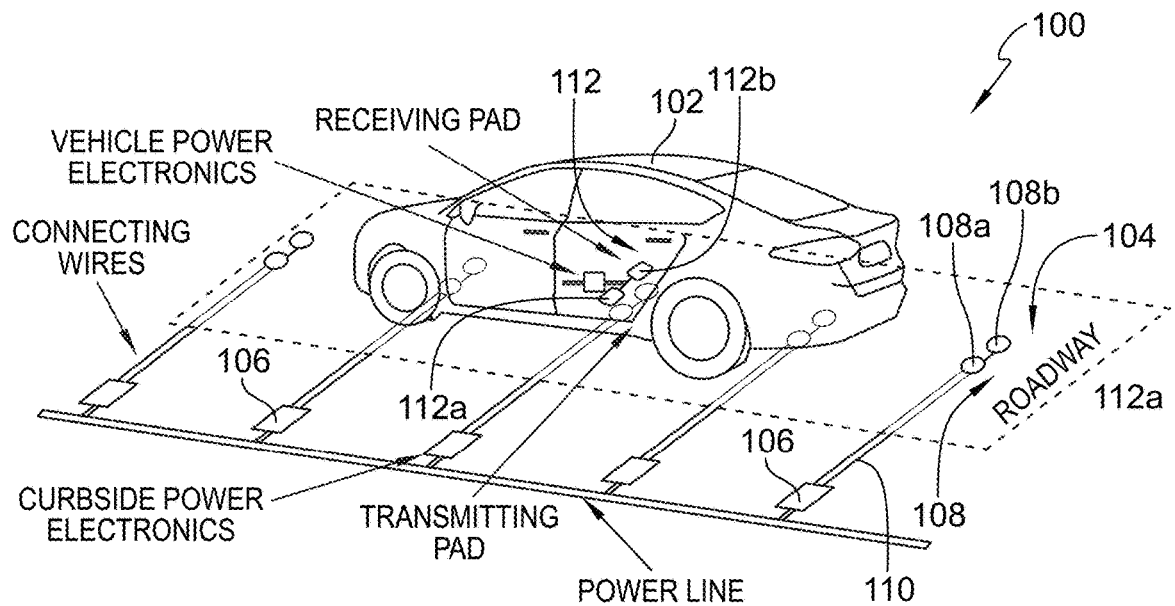
FIG. 1 is a simplified diagram illustrating one example of a capacitive wireless charging system.

FIG. 1 is a simplified diagram showing one illustrative embodiment of a wireless capacitive charging system 100 for charging a vehicle 102, according to the present disclosure. Unlike inductive WPT systems, the capacitive charging system 100 utilizes electric fields between capacitively coupled plates to transfer power from the ground to the vehicle. The wireless capacitive charging system 100 does not rely on the ferrites required by inductive WPT systems and, therefore, may be lighter, smaller, and easier to embed in a roadway. Due to the absence of ferrites, the wireless capacitive charging system 100 may be configured to operate at high frequencies without large losses of power during transfer. The wireless capacitive charging system 100 may also be made smaller in size while maintaining or increasing efficiency.

The illustrative embodiment of system 100 shown in FIG. 1 includes components that are embedded in a roadway 104. As used herein, the term "roadway" can refer to any surface designed to support one or more vehicles, whether outdoors or indoors and whether public or private. For instance, the roadway 104 may be embodied as a street or highway, but may alternatively be embodied as a floor of a plant, warehouse, or other commercial facility. It will be appreciated by those skilled in the art that the system 100 is applicable to many other types of "roadways."

In the illustrative embodiment, the system 100 includes a number of roadway-side capacitive charging pads 108 embedded in the roadway 104. The roadway-side capacitive charging pads 108 interface with a vehicle-side capacitive charging pad 112 coupled to a chassis underneath the vehicle 102. Each of the charging pads 108, 112 includes a pair of coupling plates 108a, 108b, or 112a, 112b, respectively. The system 100 also includes roadway-side power electronics 106 disposed next to (e.g., at a curb of) the roadway 104. The roadway-side power electronics 106 may be electrically coupled to each roadway-side capacitive charging pad 108 using a plurality of conductors 110 that are also (at least partially) embedded in the roadway 104. This implementation may provide ready access to the roadway-side power electronics 106 for purposes of maintenance. However, where a length of the plurality of conductors 110 connecting the roadway-side power electronics 106 and the capacitive charging pad 108 is greater than a predefined length (e.g., at least several meters, up to 10's of meters), power transfer losses may be significant, causing overall efficiency of the system 100 to be low.

To address this issue, the system 100 utilizes the parasitics generated by the conductors 110 to realize the roadway-side matching network, thereby eliminating the need for a distinct matching network in the roadway-side power electronics 106. In particular, the parasitics-based matching network formed by the plurality of conductors 110 in accordance with the present disclosure enables high voltage gain and reactive compensation while permitting minimizing stray electromagnetic fields and maintaining high overall efficiency. Furthermore, the system 100 includes a roadway embeddable charging pad 108 having a predefined pad thickness such that overall efficiency of the wireless power transfer system remains high. In an example, roadway embeddable charging pads 108 in accordance with the present disclosure may be configured to operate at 13.56-MHz and include a 12-cm air-gap to provide kilowatt-scale capacitive wireless power transfer.

As further discussed below (with reference to FIGS. 6-7B), the charging pads 108 can be made thin without a large increase in capacitance (hence, enabling a favorable tradeoff between pad thickness and system efficiency) by having a cutout section or a mesh in the back metal plane of the charging pad 108. The parasitics-based matching network (in place of a lumped element matching network) allows pulling the power electronics away from the charging pad (hence, not having to bury it in the roadway or warehouse floor) without incurring excessive additional losses in the system. It is contemplated that, in some embodiments, the system of the present disclosure could be implemented using a plurality of "charging tiles" (including charging pads 108 and conductors 110) and a plurality of "pass-through tiles" (with just conductors 110) to implement a floor for charging one or more vehicles traveling over that floor (i.e., to implement a "charging floor"). Accordingly, the disclosed wireless charging system 100 may be implemented in warehouses and other spaces or environments particularly adaptable for charging vehicles using the charging floor.

Figure 2:
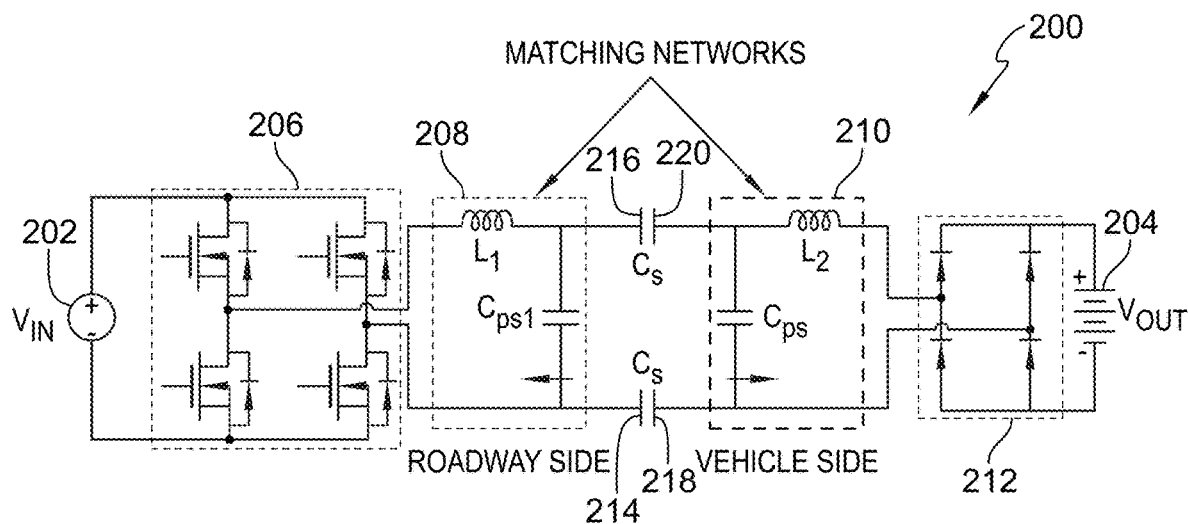
FIG. 2 is a simplified circuit diagram for the capacitive wireless charging system of FIG. 1.

FIG. 2 illustrates a simplified diagram of the wireless power transfer circuit 200 of the capacitive wireless charging system 100 for charging the vehicle 102. An inverter 206 (part of the roadway-side power electronics 106) converts the direct current (DC) input voltage received from a power source 202, such as grid power from a utility, to a high-frequency alternating current (AC) voltage. As discussed above, the plurality of conductors 110 forms a roadway-side matching network 208 and transfers a high AC voltage to the charging pad 108. The high voltage across the roadway-side coupling plates 108a, 108b (illustrated as capacitor plates 214 and 216 in FIG. 2) enables transfer of a large amount of power to the vehicle-side coupling plates 112a, 112b (illustrated as capacitor plates 218 and 220 in FIG. 2) with a relatively small displacement current through the air gap between the coupling pads 108 and 112, and hence, small fringing electric fields. A vehicle-side matching network 210 steps up small displacement current and steps down the voltage to a level compatible with an electric battery 204 of the vehicle 102. The matching networks 208, 210 together fully compensate for the reactance of the capacitive couplers, ensuring the impedance seen by the inverter 206 to be near-resistive, and hence, minimizing circulating currents.

Figure 3A:
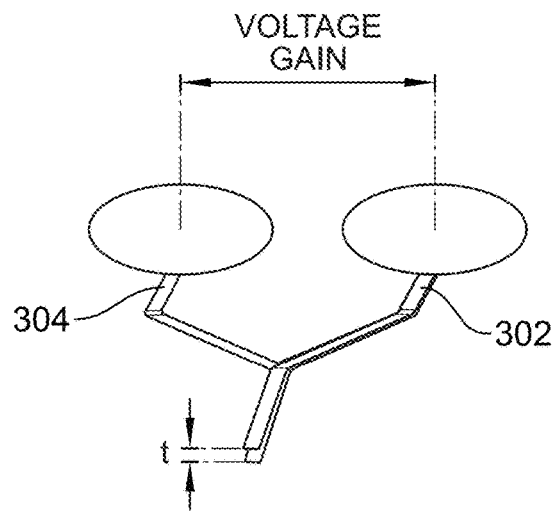
FIG. 3A is a simplified diagram illustrating one arrangement of conductors electrically connecting a power conditioning circuit and a roadway-side capacitive charging pad of the capacitive wireless charging system of FIG. 1.
Figure 3B:
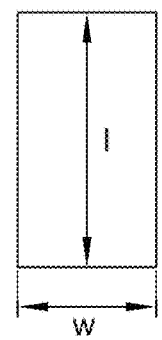
FIG. 3B is a simplified diagram illustrating a cross-sectional area of the conductor arrangement of FIG. 3A.

FIG. 3A illustrates an example arrangement 300 of the conductors 10 with respect to one another. In this example, the conductor 302 is disposed above and offset from the conductor 304 to define an air-gap t therebetween. It is contemplated that, in other embodiments, the conductors 110 may have different shapes and/or arrangements. For instance, in some embodiments, the flat conductors 302, 304 may be arranged next to one another (i.e., with their sides of smallest dimension facing each other), rather than the vertically spaced relationship shown in FIG. 3A. In other embodiments, the conductors 110 may be wires with generally circular cross-sections, rather than the relatively flat plates shown in FIGS. 3A-B. Those skilled in the art will appreciate that any of these alternative shapes and/or arrangements of the conductors 110 will impact the equations discussed below for determining the equivalent impedance of the plurality of conductors 110.

Figure 3C:
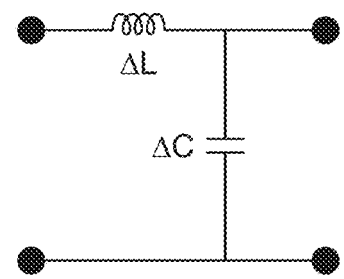
FIG. 3C is a simplified diagram illustrating an equivalent circuit model of the conductor arrangement of FIG. 3A for a small conductor length.

In the arrangement of FIG. 3A, the conductors 302, 304 provide a parallel-plate waveguide structure that may be modeled as a multistage L-section network, where each stage comprises a series inductance ($\Delta L$) and a shunt capacitance ($\Delta C$), as illustrated, for example, in FIG. 3C. These inductance and capacitance values depend on the width w of the conductors 302, 304 and the air gap t between the conductors 302, 304. The capacitance $\Delta C$ may be determined by conducting several finite-element-analysis (FEA)-based simulations across a wide range of values of air gap t and width w, and is given by Equation (1), such that:

$$\Delta C = \frac{\epsilon w}{t}\left(1 + 0.84\left(\frac{t}{w}\right)^{0.4}\right)\Delta l, \quad (1)$$

where $\Delta l$ is indicative of a length l of the conductors modeled by a single L-section stage and $\epsilon$ is indicative of the permittivity of the material between the conductors 302, 304. The value of $\Delta L$ may be determined using Equation (2), such that:

$$\Delta L = \frac{\mu \epsilon \Delta l^2}{\Delta C} \quad (2)$$

Using the model for the individual L-section stages, the equivalent impedance of the multistage L-section network modeling the pair of conductors 110 may be expressed using Equation (3), such that:

$$Z = -j\sqrt{\frac{\mu_0}{\epsilon}}\left(\frac{t}{w}\right)\frac{1}{1 + 0.84\left(\frac{t}{w}\right)^{0.4}}\cot\left(2\pi f_s l\sqrt{\mu_0 \epsilon}\right), \quad (3)$$

where l is the total length of the conductors 110 and f is the operating frequency of the wireless power transfer system. Due to the cotangent function in Equation (3), the equivalent impedance of the pair of connecting conductors 302, 304 can be either inductive or capacitive depending on the length of the conductors 302, 304 and the operating frequency of the wireless power transfer system. The length of these conductors 302, 304 can therefore be designed to create an inductive reactance and provide reactive compensation in different embodiments of the capacitive wireless charging system 100.

Figure 4:
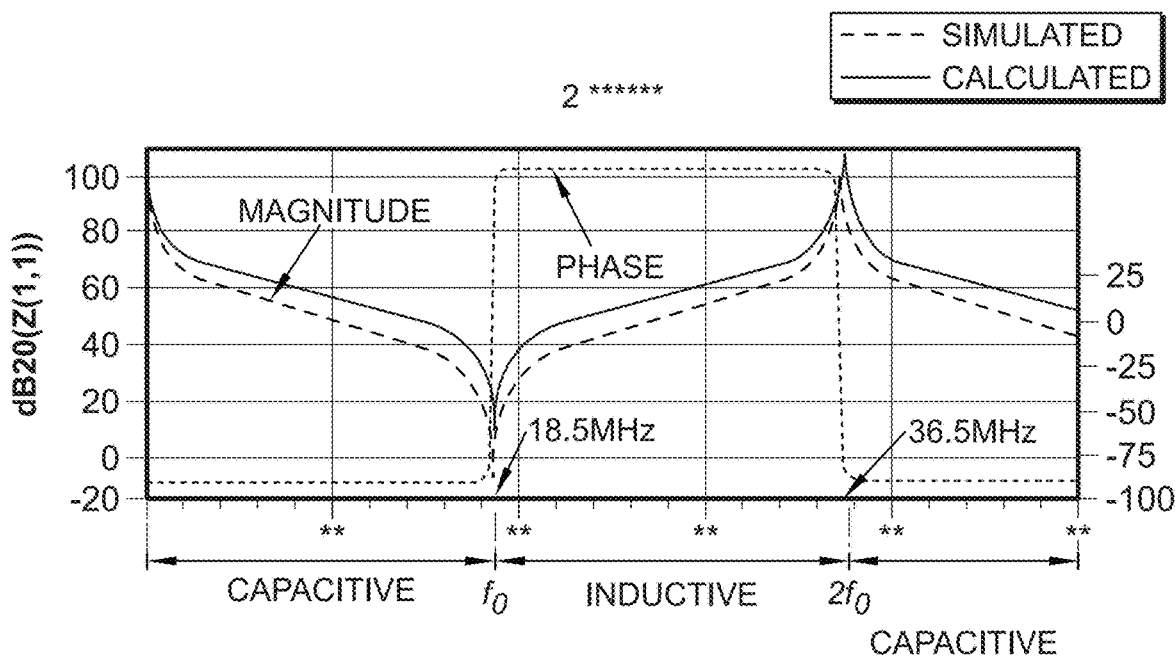
FIG. 4 is a graph illustrating simulated and calculated equivalent impedance of the conductor arrangement of FIG. 3A as a function of the operating frequency (using a conductor length of 4 m, a conductor width of 7 mm, and a conductor separation of 1.27 cm)

FIG. 4 is a graph illustrating impedance of the conductors 302, 304 determined analytically with respect to impendence of the conductors 302, 304 determined using FEA-based simulation. In an example, the conductors 302, 304 may each have a width w of 7 mm and a length l of 4 m and may be disposed with respect to one another to define a spacing t of 1.27 cm therebetween. The conductors 302, 304 of the capacitive wireless charging system 100 are configured to step-up voltage output by the power conditioning circuit 106. The voltage gain provided by the conductors 302, 304 may be expressed using Equation (4), such that:

$$G_v = \frac{\hat{V}_{out}}{\hat{V}_{in}} = \prod_{n=1}^{N}\frac{\sqrt{(k^2 + kZ(n\Delta l)\omega_s^2 \Delta C^2(kZ(n\Delta l) - \omega_s \Delta L))^2 + (k\omega_s^2 \Delta L \Delta C)^2}}{k^2 + \omega_s^2 \Delta C^2(kZ(n\Delta l) - \omega_z \Delta L)^2}, \quad (4)$$

where $$k = \frac{\omega_s Z(n\Delta l)\Delta C}{\omega_s^2 \Delta C^2 Z(n\Delta l)^2 + 1},$$

Figure 5A:
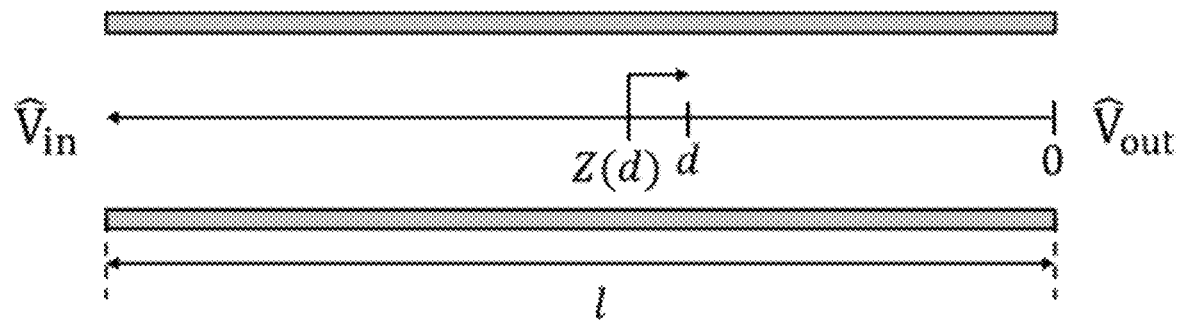
FIG. 5A is a simplified diagram illustrating the equivalent impedance of the conductor arrangement of FIG. 3A as seen at a distance (d) from its end.

$Z(n\Delta l)$ is the equivalent impedance of the conductors 302, 304 calculated using Equation (3) at a distance $d=n\Delta l$ from end of the conductors 302, 304, as illustrated in FIG. 5A, and $$N = \frac{l}{\Delta l}$$

is representative of a total number of segments modeling the conductors 302, 304 where each segment can be modeled as a single L-section stage (see FIG. 3C).

Figure 5B:
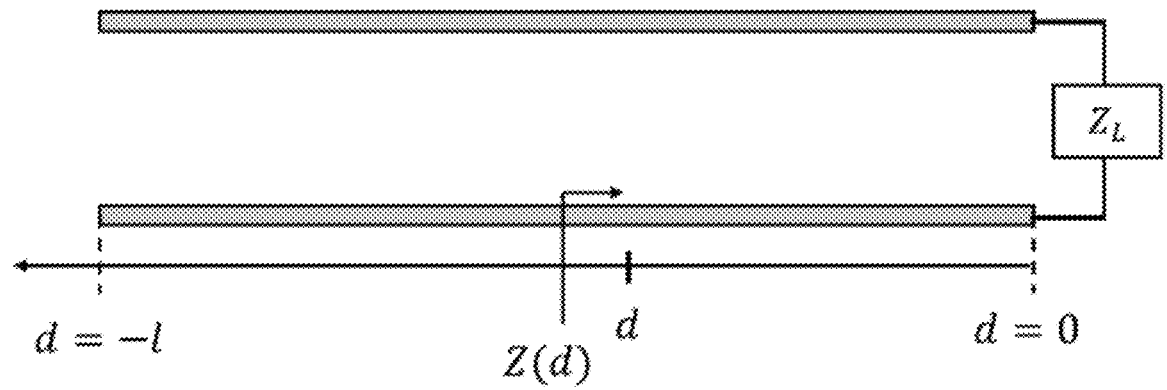
FIG. 5B is a simplified diagram illustrating the equivalent impedance of the conductor arrangement of FIG. 3A, when coupled to a load, as seen at a distance (d) from the load.
Figure 5C:
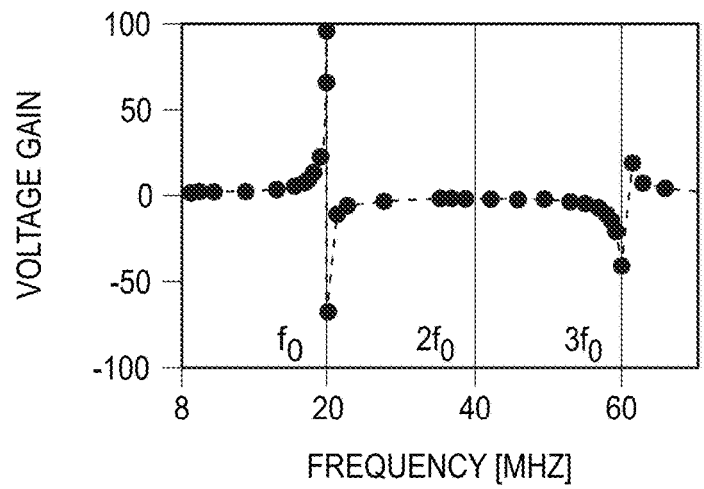
FIG. 5C is a graph illustrating simulated voltage gain of the conductor arrangement of FIG. 3A as a function of the operating frequency (using a conductor length of 4 m, a conductor width of 7 mm, and a conductor separation of 1.27 cm)

FIG. 5C is a graph illustrating a change in the voltage gain of the conductors 302, 304 with respect to a change in operating frequency of the wireless power transfer system determined using FEA simulations. As illustrated in FIG. 5C, the conductors 302, 304 provide high voltage gains when the operating frequency $f_s$ of the wireless power transfer system approaches odd multiples (i.e., harmonics) of a fundamental resonant frequency $f_0$ of the system, such that $f_s$ (2n+1)$f_0$ (where $$f_0 = \frac{1}{4l\sqrt{\mu_0 \epsilon}},$$

n=0, 1, 2, ..., and c is indicative of a speed of the wave in the medium). As illustrated in at least FIGS. 4 and 5A-5B, the conductors 302, 304 may be configured to provide the reactive compensation and the voltage gain required from the roadway-side matching network. Accordingly, any discrete inductors and capacitors, as well as, associated losses of these components may be eliminated. The system of the present disclosure leverages the parasitics of the conductors 110 to extract the required matching network functionality in the system 100.

Figure 6:
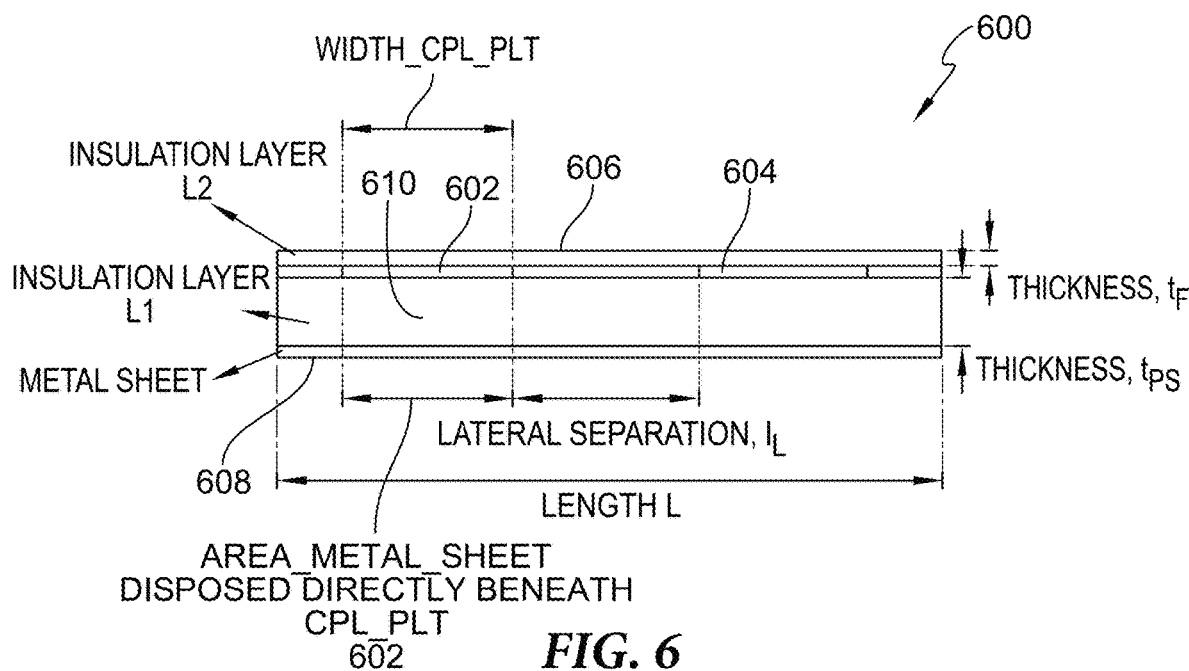
FIG. 6 is a simplified diagram illustrating a cross-section of one embodiment of the presently disclosed roadway-side capacitive charging pad.

In practice, power may be transferred wirelessly to the electric vehicle 102 as the vehicle 102 moves over each of the charging pads 108 embedded in the roadway 104. FIG. 6 illustrates an example implementation 600 of the charging pads 108. In the implementation 600, the coupling plates 602, 604 are disposed within a housing (or case) 606. The housing 606 may include a metal sheet 608 disposed at a base of the housing 606 and configured to provide rigidity. The metal sheet 608 may form an electromagnetic shield between the coupling plates 602, 604 and the roadway 104, minimizing the effect of surrounding dissipative materials, such as asphalt.

The coupling plates 602, 604 and the metal sheet 608 are separated by an insulation layer (L1) 610. A thickness $t_{ps}$ of the insulation layer 610 may determine the capacitance formed between the coupling plates 602, 604 and the metal sheet 608. The capacitance between the coupling plates 602, 604 and the metal sheet 608 and the impedance generated by the conductors 110 connecting the roadway-side charging pad 108 to the roadway-side power electronics 106, such as conductors 110 described in reference to FIG. 1, form the roadway-side matching network. Since high voltages may develop between the coupling plates 602, 604 and the metal sheet 608, e.g., at kilowatt-scale power levels, a height or thickness of the insulation layer 610 may be such that dielectric strength of the insulation layer 610 blocks these voltages. Material of the insulation layer 610 may also have a high tensile strength such that the thickness of the insulation layer 610 may remain unaltered despite the weight of the vehicle 102. The material of the insulation layer 610 may also have a low loss tangent to prevent or minimize energy losses at multi-MHz kilowatt-scale operation. While a number of insulating materials such as porous SiO2 have been used in electronics industry as dielectric materials, they have very low tensile strength, and hence, are not ideal for this application. In some instances, material of the insulation layer 610 may be material having high dielectric strength, low loss tangent, and high tensile strength, such as, for example, Teflon.

The length, l, of the charging pad 108 is primarily determined by the size of the coupling plates and the lateral distance between the plates, $l_l$, while the width is determined only by the size of the plates. Having a pad length or width greater than this does not add any benefit, since both the matching network and the air-gap capacitances remain unchanged. The lateral separation between the plates, $l_l$, can be selected as a tradeoff between the overall pad size and the effect of cross-interaction between diagonal plate-pairs of the roadway-side and vehicle-side pads.

The distance between the coupling plates and the metal sheet, $t_{PS}$, can be varied to obtain different values of matching network capacitances. Each of these capacitances may lead to a different system design and hence, different system efficiencies. In an example, a simulated system efficiency as a function of a plate-to-sheet distance, $t_{PS}$, where the values of capacitances for each value of $t_{PS}$, indicates that a thinner Teflon layer, i.e. a larger matching network capacitance leads to a lower system efficiency. This phenomena may be due to a larger capacitance requiring more current to generate high voltage across the roadway-side coupling plates leading to higher currents and losses in the matching network inductances. Accordingly, a higher system efficiency may come at the cost of increased thickness, $t_{PS}$, and hence increased pad size, weight, and cost.

Figure 7A:
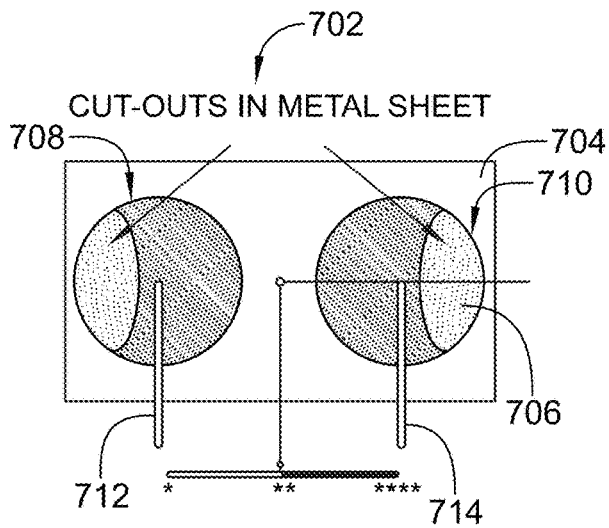
FIG. 7A is a simplified diagram illustrating one embodiment of the presently disclosed roadway-side capacitive charging pad with cut-outs in the metal sheet backing.

FIG. 7A illustrates an example charging pad 702. At least a portion of a metal sheet 704 of the charging pad 702 may be removed to expose an insulation layer 706 disposed between the metal sheet 704 and coupling plates 708, 710 of the charging pad 702. In an example, the metal sheet 704 of the charging pad 702 defines cut-outs (or removed portions) within an area of the metal sheet 704 disposed directly beneath the coupling plates 708, 710 (see, e.g., FIG. 6). Each of the removed portions of the metal sheet 704 cut-outs cause a capacitance between a corresponding one of the coupling plates 708, 710 and the metal sheet 704 to become smaller (i.e., to decrease) as compared to a charging pad without removed portions or cut-outs, for a given Teflon thickness $t_{PS}$. A capacitance having a smaller magnitude requires smaller amount of current to generate a predefined high voltage across the roadway-side coupling plates 108a, 108b, and, hence, smaller energy and power losses in connecting conductors 712, 714 such that a system efficiency is higher in the wireless power transfer system having one or more portions of the metal sheet 704 removed than in the wireless power transfer system having a fully intact metal sheet 704. Achieving this high efficiency with a smaller Teflon thickness than a conventional pad enables a smaller pad size, as well as lesser weight and cost.

Reducing capacitance of the matching network may be accomplished by making a cut-out in the metal sheet beneath the coupling plates may enable a better tradeoff between efficiency and pad size without increasing the thickness of Teflon. Measuring efficiency as a function of layer thickness $t_{PS}$ of a coupling plate having a cut-out area equal to 50% of the area indicates that, for a given Teflon thickness, a higher system efficiency may be achieved in such a cut-out charging pad. Purely as an example, for a Teflon layer thickness of 1.27 cm, a pad with the cut-out results in 6% higher system efficiency. The cut-out shape may be elliptical to restrict the high-strength electric fields to a region within the couplers. It will be appreciated that, in the illustrative embodiments, the cut-outs do not include any sharp or angled corners, so as not to create large, irregular, and interfering electric fields, which may cause arcing and electrical breakdown.

In other examples, relationship between value of the matching network capacitance as a function of one or more of the cut-out area of the charging pads, Teflon layer thickness and the area of the coupling plates may be determined.

Figure 7B:
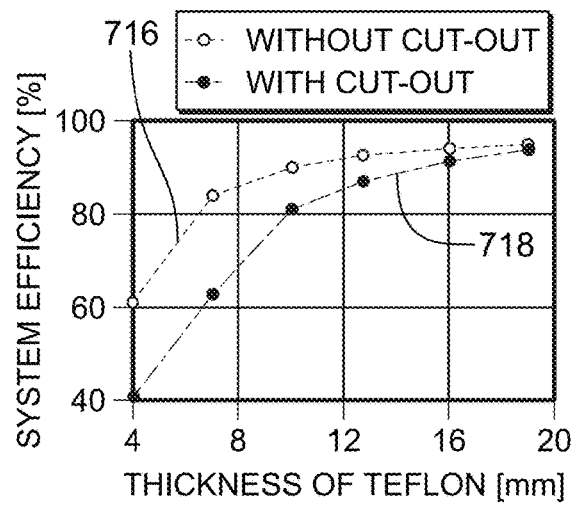
FIG. 7B is a graph illustrating simulated system efficiency as a function of the insulation layer thickness for a 13.56-MHz 3.75-kW system using the presently disclosed capacitive charging pad design with 50% cut-out area, compared to a conventional pad.

FIG. 7B is a graph illustrating relative relationship between a change in an efficiency of an example wireless power transfer system with respect to a change in thickness $t_{sp}$ of the insulation layer 706 of that wireless power transfer system, where a first curve 716 illustrates efficiency of a charging pad having a fully intact metal sheet, i.e., without one or more portions of the metal sheet 704 being removed, and a second curve 718 illustrates efficiency of a charging pad having one or more portions of the metal sheet removed. For a given thickness of the insulating layer, e.g., 19 mm, efficiency of the charging pad with the removed portions may be equal to or greater than efficiency of the charging pad with all portions of the metal sheet 704 being intact. Accordingly, the charging pad of the present disclosure provides high-frequency, high-efficiency capacitive wireless power transfer to charge the electric vehicle 102, while also supporting adaptation of the charging pad design to balance favorable tradeoffs between power transfer efficiency of the system and size.

Figure 8A:
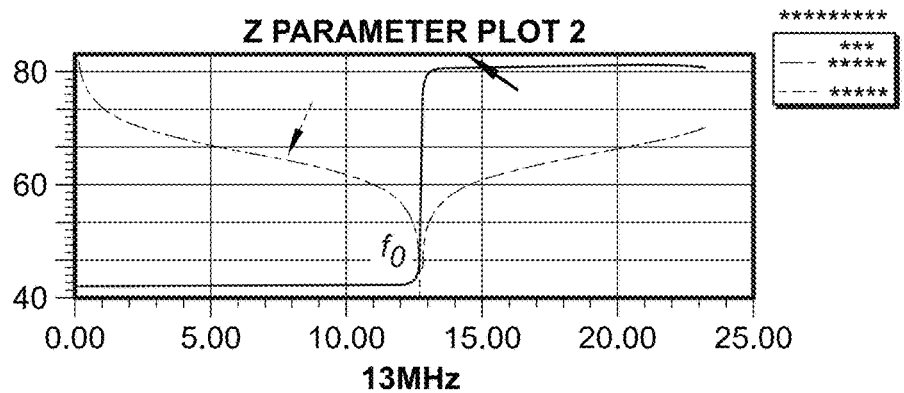
FIG. 8A is a graph illustrating simulated equivalent impedance.
Figure 8B:
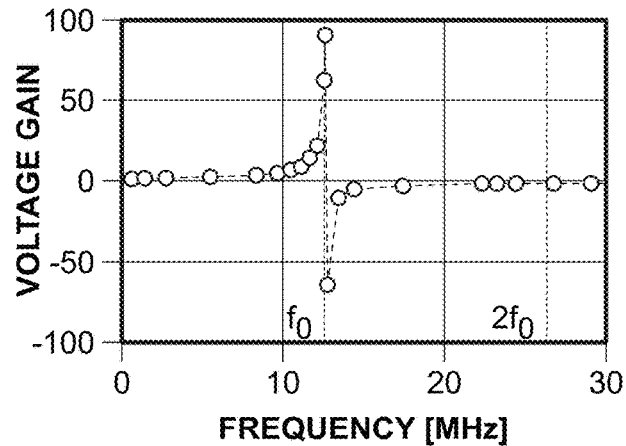
FIG. 8B is a graph illustrating simulated voltage gain of the parallel plate waveguide structure having the same physical dimensions as in FIG. 4 with a charging pad connected at its end.

FIGS. 8A and 8B are graphs illustrating the FEA-simulated equivalent impedance and voltage-gain, respectively, for a given example pair of conductors 110 as considered in FIG. 4 (connected to a charging pad 108 at its end). The charging pad is designed to have a cut-out area of 50% and Teflon thickness of 1.2 cm. It can be seen by comparing FIG. 8 with FIG. 4 (and FIG. 5) that, when the parallel plate waveguide structure formed by the conductors 110 is connected to the charging pad, its fundamental resonant frequency changes. As the charging pad loads the waveguide structure with a capacitance at its end, the overall resonant frequency is lowered. Hence, the resonant frequency of the system is now determined by both length of the conductors 110 and equivalent capacitance of the charging pad. Different conductor dimensions w, t and pad Teflon thickness $t_{PS}$ may change equivalent impedance of the conductors 110 such that an optimum matching network that leads to the highest system efficiency for a given operating frequency may be achieved.

Figure 9A:
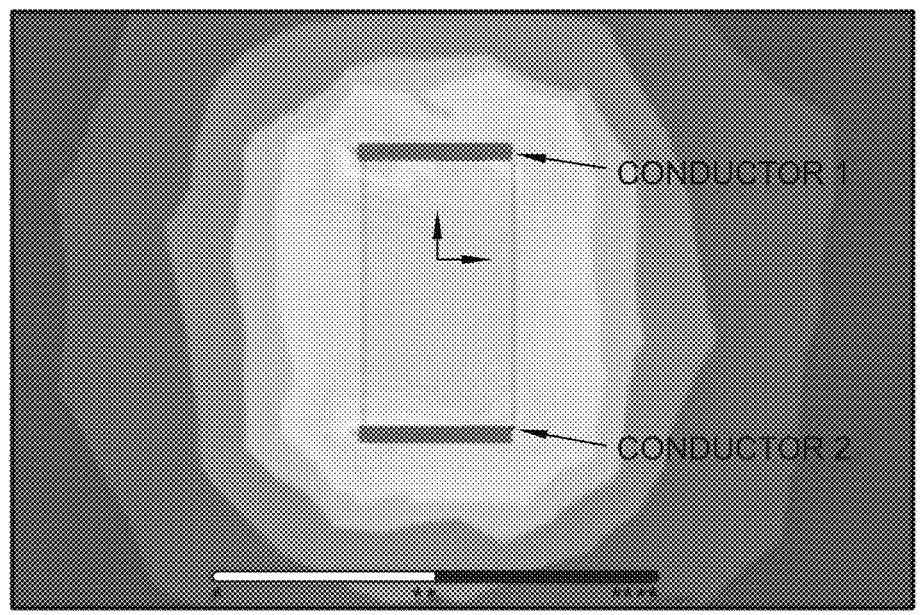
FIG. 9A is a graph illustrating stray magnetic fields around the conductor arrangement of FIG. 3, simulated using finite element analysis.
Figure 9B:
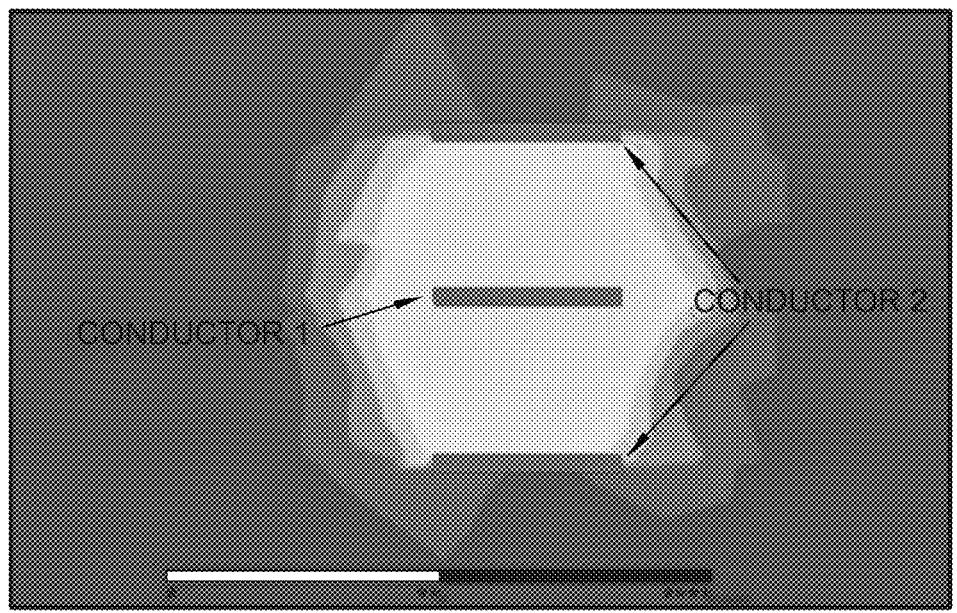
FIG. 9B is a graph illustrating stray magnetic fields around an alternative interleaved conductor arrangement, simulated using finite element analysis.

A challenge in multi-MHz capacitive wireless power transfer systems is to provide the high-strength electric and magnetic fields within predefined sizes and values, such as sizes and values included in the guidelines of International Commission on Non-Ionizing Radiation Protection (IC-NIRP). FIG. 9A shows the FEA-simulated stray magnetic fields around the conductors for 1 A current flowing through them. The fields are not restricted and emanate out in the surrounding regions. In some embodiments, these fields may be contained by interleaving the conductors 110. As illustrated in FIG. 9B, one of the conductors 110 is sandwiched between two outer conductors 110, where the two outer conductors 110 are electrically coupled together. Compared to the conductor arrangement of FIG. 3A (discussed above), this interleaving helps to restrict the high-strength magnetic fields within the region of the conductors 110. These different approaches to implement the parallel plate waveguide can be combined to achieve a favorable tradeoff between system efficiency and field confinement.

A pair of exemplary charging pads, one each for the roadway-side and the vehicle-side, were made and tested with the geometrical parameters listed in Table I below.

TABLE I

| Physical Dimensions of the Designed Charging Pads | |
|---|---|
| Length, l (cm) | 60 |
| Width (cm) | 30 |
| Lateral separation, $l_L$ (cm) | 10 |
| Cut-out area. A (cm²) | 190 |
| Layer L1 thickness, $t_{ps}$ (cm) | 1.27 |
| Layer L2 thickness, $t_f$ (cm) | 1 |

Figure 10A:
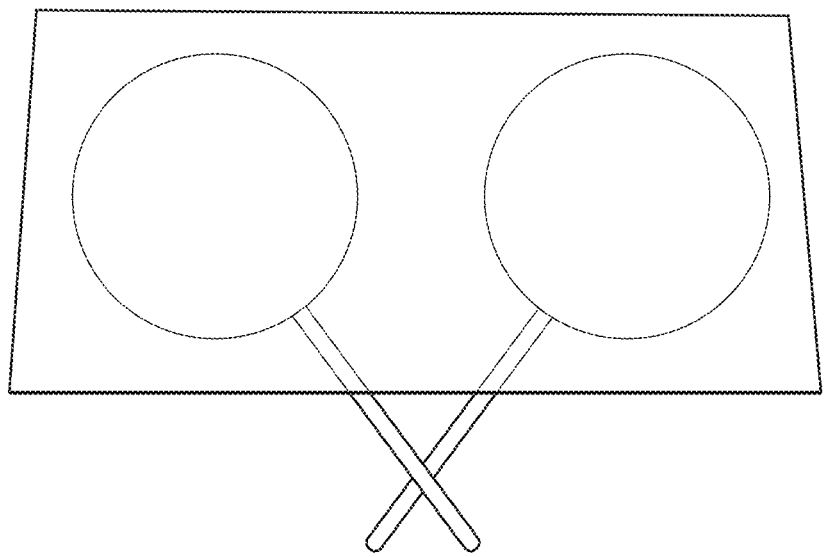
FIG. 10A shows a top view of a working example of the presently disclosed roadway-side capacitive charging pad.
Figure 10B:
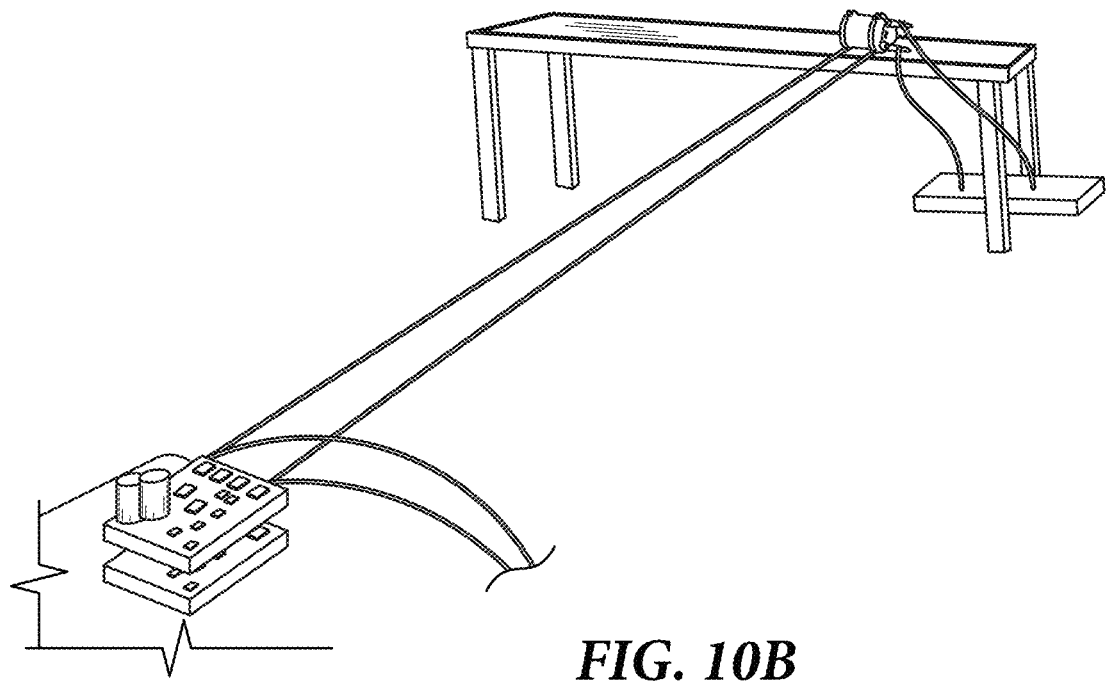
FIG. 10B shows an experimental set-up constructed to test the presently disclosed capacitive wireless charging system.

The roadway-side capacitive charging pad 108 was connected to the power conditioning circuit 106, without using discrete capacitors or inductors, using a plurality of conductors 110 of lengths 4 m and width 7 mm. This system was tested both with a separation of 1.27 cm between the two conductors 110 and a separation of 15 cm between the two conductors 110 (see FIG. 10B). This difference in separation was used to validate that changing the separation changes the per-unit capacitance and inductance of the parallel plate waveguide structure, and hence changes the overall system efficiency. The inverter transistors were realized using 650-V GaN transistors. The vehicle-side matching network inductor was implemented as Toroidal Interleaved-Foil (TIF) inductor to realize a very high quality factor.

Figure 11A:
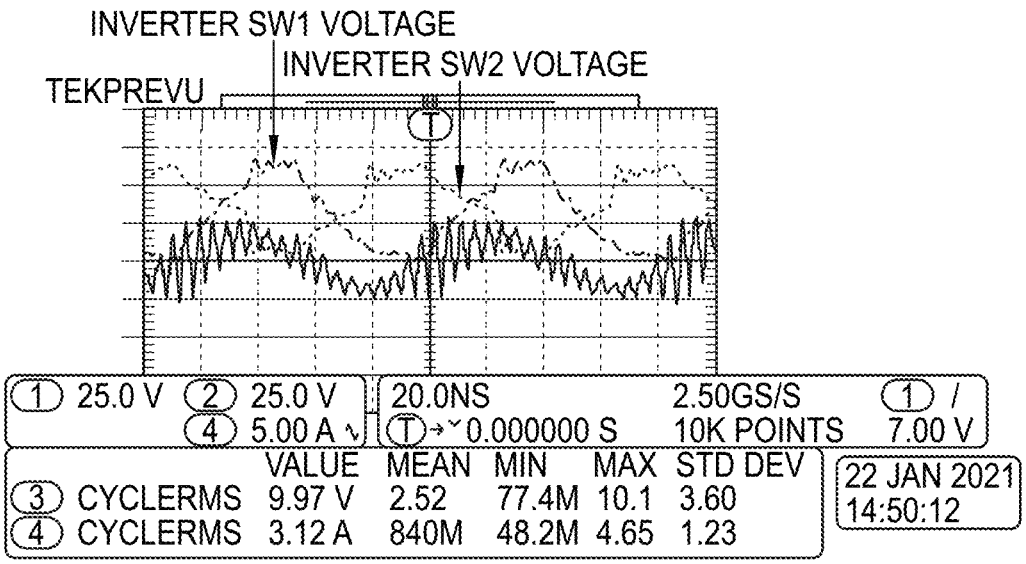
FIGS. 11A-11B are graphs illustrating operating waveforms observed in one illustrative embodiment of a 13.56 MHz large air-gap capacitive wireless charging system.
Figure 11B:
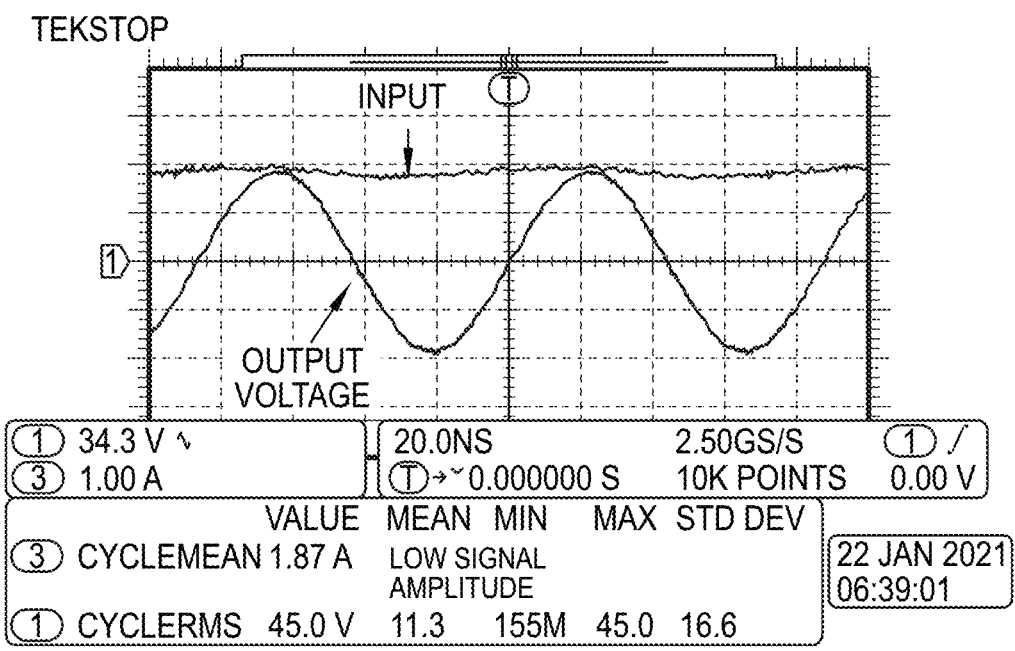
Figure 12A:
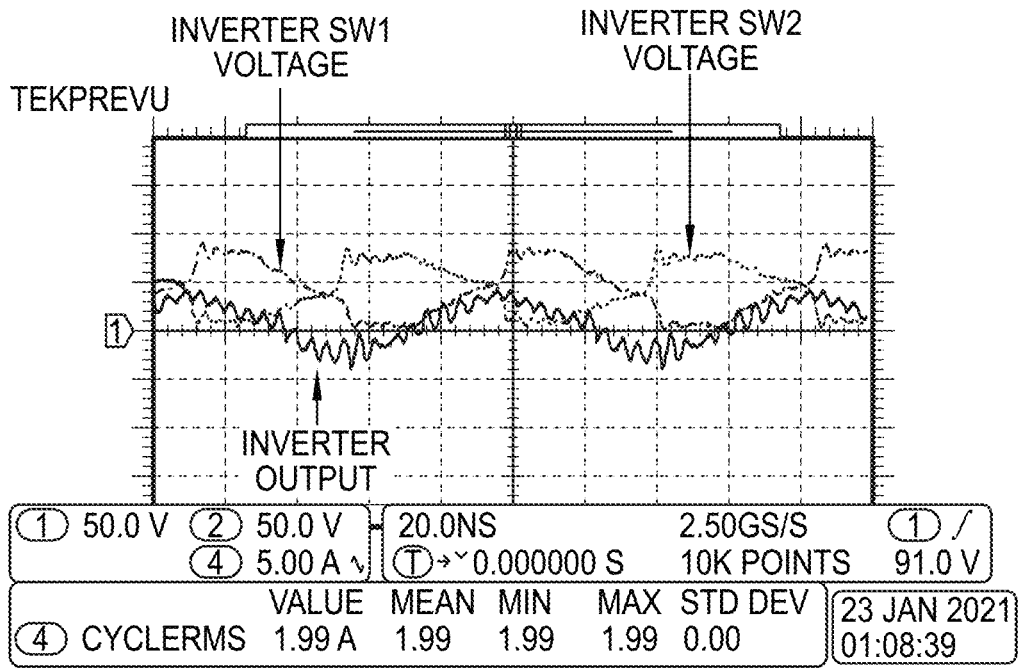
FIGS. 12A-12B are graphs illustrating operating waveforms observed in another illustrative embodiment of a 13.56 MHz large air-gap capacitive wireless charging system.
Figure 12B:
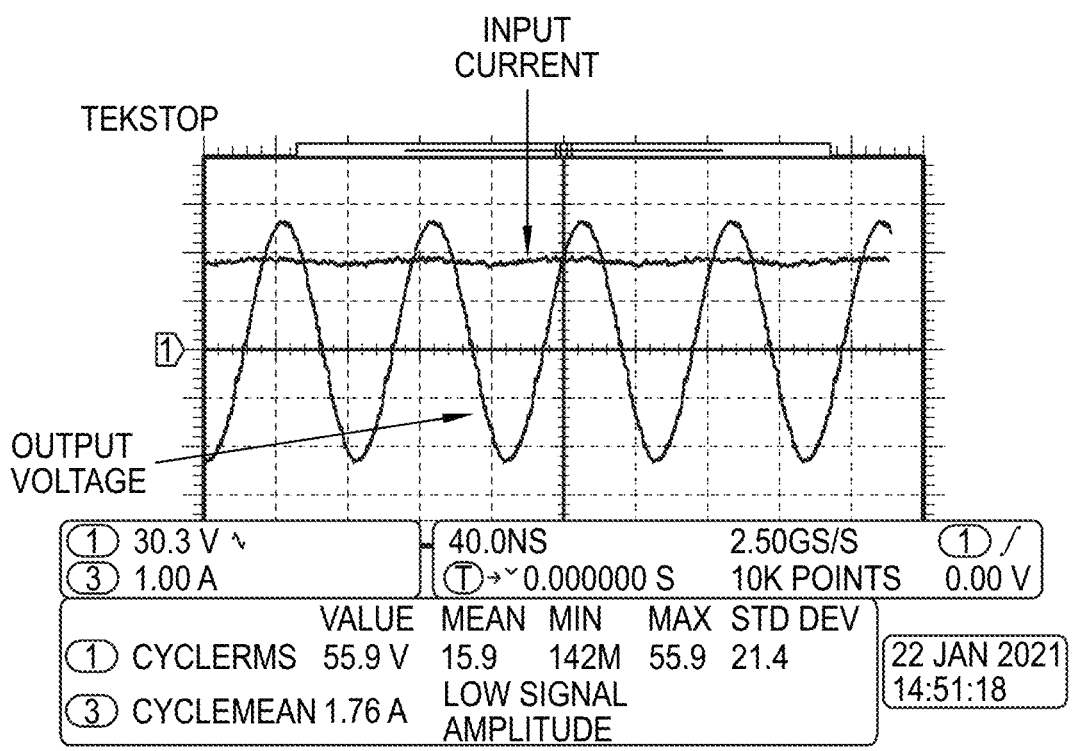

FIG. 11A illustrates example waveforms of the inverter switch-node (SW) voltages and inverter output current of the system 100 in which the conductors 110 were separated by 1.27 cm. FIG. 11B illustrates example waveforms of inverter input current and the output voltage of the same system 100 as FIG. 11A. It can be seen from the smooth transitions of the inverter switch-node voltages that the inverter transistors achieve zero-voltage, zero-current switching. This prototype transfers 50 W output power at an efficiency of 40%. FIGS. 12A and 12B show the measured waveforms of the system 100 in which the conductors 110 were separated by 15 cm, while transferring 100 W output power at 60% efficiency. This second system achieved a higher efficiency compared to the first system because of the larger separation of the conductors 110, which resulted in a smaller matching network capacitance (closer to the optimum design at this frequency).

As discussed above, in some embodiments, the connecting conductors 302, 304 may form a parallel-plate waveguide structure. If a length of the conductors 302, 304 is much bigger than the separation between the conductors 302, 304, the conductors 302, 304 may be considered a transmission line. As illustrated in at least FIG. 5B, the impedance Z looking towards a load at a location d in a transmission line may be expressed using Equation (5) such that:

$$Z(d) = Z_0 \frac{1 + \tau_L e^{2jkd}}{1 - \tau_L e^{2jkd}}, \quad (5)$$

where $Z_0$ is the characteristic impedance of the transmission line, $$\tau_L = \frac{Z_L - Z_0}{Z_L + Z_0}$$

is the load reflection coefficient of the transmission line and k is the wavenumber for the waves travelling through the transmission line. For a transmission line that is unloaded at an end (i.e., for an open-circuit load), the load impedance $Z_L = \infty$ and may be expressed using Equation (6), such that $$\tau_L = 1 \quad (6)$$

Using the value of $\tau_L$ determined in accordance to Equation (5) and simplifying, the equivalent impedance of the conductors 110 looking into the input may be expressed using Equation (7) such that $$Z(-l) = -jZ_0 \cot(kl) \quad (7)$$

Substituting the characteristic impedance $Z_0$ with $$\frac{\Delta L}{\Delta C}$$

in Equation (7) and using $$k = \omega_S \sqrt{\frac{\Delta L \Delta C}{\Delta l^2}}$$

(the dispersion relation of a transmission line) may be expressed using Equation (8), which corresponds to Equation (3), such that $$Z = -j\sqrt{\frac{\mu_0}{\epsilon}} \left(\frac{t}{w}\right) \frac{1}{1 + 0.84\left(\frac{t}{w}\right)^{0.4}} \cot(2\pi f_s l \sqrt{\mu_0 \epsilon}), \quad (8)$$

The total voltage gain provided by the conductors 108 may be calculated by determining the voltage gain provided by a segment of the conductor 110 modeled by a single L-section. If the conductor segment is located at a distance d from the end of the conductor 110, the voltage gain provided by the conductor segment may be expressed using Equation (9), such that $$G_{vd} = \left| \frac{\frac{-j}{\omega_S \Delta C} \| Z(d)}{\frac{-j}{\omega_S \Delta C} \| Z(d) + j\omega_S \Delta L} \right|. \quad (9)$$

The total voltage gain of the plurality of conductors 110 is given by the product of voltage gains provided by each such conductor segment and may be expressed using Equation (4).

While the concepts of the present disclosure are susceptible to various modifications and alternative forms, specific exemplary embodiments are been shown by way of example in the drawings and described above. It should be understood, however, that there is no intent to limit the concepts of the present disclosure to the particular forms disclosed; on the contrary, the intention is to cover all modifications, equivalents, and alternatives falling within the spirit and scope of the invention as defined by the appended claims.

For instance, and without limitation, the present disclosure can be advantageously implemented in environments other than traditional roadways (e.g., highways, streets, intersections, etc.), including any surface designed to support one or more vehicles, whether public or private, whether outdoors or indoors. Furthermore, the presently disclosed systems can be used with any type of vehicle, including, but not limited to, manned or unmanned vehicles, passenger vehicles, non-passenger vehicles, drones (terrestrial or non-terrestrial), robots, cars, trucks, motorcycles, scooters, bicycles, carts, off-road vehicles, farm equipment, boats, submarines, etc. By way of the example, the presently disclosed systems could be implemented in portions of a floor inside of a commercial facility to supply power to autonomous vehicles travelling within the facility. In other embodiments, the presently disclosed systems may comprise elevated capacitive charging pads to facilitate use with non-terrestrial (e.g., airborne) drones or submerged capacitive charging pads to facilitate use with a submarine or boat. Moreover, while the present disclosure includes examples of wireless charging of a moving vehicle, the present concepts may also advantageously be implemented for wireless charging of a stationary vehicle (e.g., a charging-station variant) or a temporarily stationary vehicle (e.g., a vehicle stopped at an intersection or at a traffic light, etc.).

References in the specification to "one embodiment," "an embodiment," "an illustrative embodiment," "aspect," "example," etc., indicate that the described embodiment may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C); (A and B); (B and C); (A and C); or (A, B, and C). Similarly, items listed in the form of "at least one of A, B, or C" can mean (A); (B); (C); (A and B); (B and C); (A and C); or (A, B, and C).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

There are a plurality of advantages of the present disclosure arising from the various features of the methods, apparatus, and systems described herein. It will be noted that alternative embodiments of the method, apparatus, and system of the present disclosure may not include all of the features described yet still benefit from at least some of the advantages of such features. Those of ordinary skill in the art may readily devise their own implementations of the method, apparatus, and system that incorporate one or more of the features of the present invention and fall within the spirit and scope of the present disclosure as defined by the appended claims.

The invention claimed is:

1. A wireless capacitive charging system for a roadway, the system comprising:
 a vehicle including a vehicle-side charging circuit configured to wirelessly receive power to charge a vehicle battery when the vehicle is on the roadway, the vehicle-side charging circuit having a rectifier electrically connected to the vehicle battery, a vehicle-side capacitive charging pad, and a vehicle-side matching network electrically connecting the rectifier and the vehicle-side capacitive charging pad, a roadway-side capacitive charging pad embedded in the roadway and configured to form a capacitive electrical connection with the vehicle-side capacitive charging pad for wirelessly transferring power, a power conditioning circuit configured to condition power received from a power source, and a plurality of conductors at least partially embedded in the roadway and electrically connecting the power conditioning circuit and the roadway-side capacitive charging pad, wherein the plurality of conductors, at least in part, form a roadway-side matching network, and wherein the roadway-side and vehicle-side matching networks together fully compensate for a reactance of the capacitive electrical connection during power transfer across the capacitive electrical connection, wherein the roadway-side capacitive charging pad comprises:
 a pair of laterally-spaced capacitive plates each electrically connected to one of the pair of conductors,
 a conductive sheet arranged below the pair of capacitive plates to electromagnetically shield the pair of capacitive plates from surrounding dissipative materials, and
  a first insulation layer that separates the pair of capacitive plates from the conductive sheet.

2. The system of claim 1, wherein an impedance seen by the power conditioning circuit at its connection to the plurality of conductors is near resistive during power transfer across the capacitive electrical connection.

3. The system of claim 1, wherein the roadway-side matching network does not include any discrete inductors or capacitors.

4. The system of claim 1, wherein the plurality of conductors comprises a pair of conductors arranged in spaced apart relation with a gap of a predetermined size between the pair of conductors.

5. The system of claim 4, wherein the predetermined size of the gap is defined according to a multistage L-section network model based, at least, on dimensions of the pair of conductors, on a permittivity of material disposed in the gap between the pair of conductors, and on a frequency of the conditioned power supplied by the power conditioning circuit to the pair of conductors.

6. The system of claim 1, wherein the first insulation layer comprises a dielectric material.

7. The system of claim 1, wherein the conductive sheet is formed to include at least one cut-out arranged beneath a first capacitive plate of the pair of capacitive plates to decrease a capacitance between the first capacitive plate and the rigid metal sheet.

8. The system of claim 7, wherein the rigid metal sheet is further formed to include at least one cut-out arranged beneath a second capacitive plate of the pair of capacitive plates to decrease a capacitance between the second capacitive plate and the rigid metal sheet.

9. The system of claim 1, wherein the roadway-side capacitive charging pad includes a second insulation layer that overlies the pair of capacitive plates.

10. The system of claim 9, wherein the roadway-side capacitive charging pad includes a third insulation layer that fills a space between the pair of laterally-spaced capacitive plates and that extends between the first and second insulation layers.

11. The system of claim 1, wherein the vehicle comprises an unmanned vehicle, a robot, or a terrestrial drone.

12. The system of claim 1, wherein the conductive sheet is a metal sheet.

13. The system of claim 1, wherein the plurality of conductors form a roadway-side matching network, and wherein the roadway-side and vehicle-side matching networks together fully compensate for a reactance of the capacitive electrical connection during power transfer across the capacitive electrical connection.

14. A wireless capacitive charging system for use with a vehicle, the system comprising:
 a roadway-side capacitive charging pad embedded in a roadway and configured to form a capacitive electrical connection with a vehicle-side capacitive charging pad for wirelessly transferring power to charge a vehicle battery when the vehicle is on the roadway,
 a power conditioning circuit positioned next to the roadway and configured to condition power received from a power source, and
 a plurality of conductors at least partially embedded in the roadway and electrically connecting the power conditioning circuit and the roadway-side capacitive charging pad, wherein the plurality of conductors form, at least in part, a roadway-side matching network for the capacitive electrical connection,
 wherein the roadway-side capacitive charging pad comprises:
  a pair of laterally-spaced capacitive plates each electrically connected to one of the pair of conductors,
  a conductive sheet arranged below the pair of capacitive plates to electromagnetically shield the pair of capacitive plates from surrounding dissipative materials, and
  a first insulation layer that separates the pair of capacitive plates from the conductive sheet.

15. The system of claim 13, wherein an impedance seen by the power conditioning circuit at its connection to the plurality of conductors is near resistive during power transfer across the capacitive electrical connection.

16. The system of claim 14, wherein the roadway-side matching network is configured to cooperate with a vehicle-side matching network such that the roadway-side and vehicle-side matching networks together fully compensate for a reactance of the capacitive electrical connection during power transfer across the capacitive electrical connection.

17. The system of claim 13, wherein the rigid metal sheet is formed to include at least one cut-out arranged beneath each plate of the pair of capacitive plates to decrease a capacitance between the pair of capacitive plates and the rigid metal sheet.

18. The system of claim 14, wherein the plurality of conductors form the roadway-side matching network without discrete inductors and capacitors.

19. A wireless capacitive charging system for a vehicle, the system comprising:
 a rectifier electrically connected to a vehicle electrical power system;
 a roadway-integrated capacitive charging pad comprising:
  a pair of laterally-spaced capacitive plates each electrically connected to one of the plurality of conductors,
  a conductive sheet arranged below the pair of capacitive plates to electromagnetically shield the pair of capacitive plates from surrounding dissipative materials, and a first insulation layer that separates the pair of capacitive plates from the conductive sheet;

a vehicle capacitive charging pad configured to form a capacitive electrical connection with a roadway-integrated capacitive charging pad for wirelessly receiving power, and a vehicle matching network electrically connecting the vehicle capacitive charging pad to the rectifier, wherein the vehicle matching network is configured to cooperate with a roadway-integrated matching network electrically connected to the roadway-integrated capacitive charging pad such that the vehicle and roadway-integrated matching networks together fully compensate for a reactance of the capacitive electrical connection during power transfer across the capacitive electrical connection.

20. The system of claim 19, wherein the vehicle matching network comprises a Toroidal-Interleaved-Foil inductor.

21. A vehicle comprising the wireless capacitive charging system of claim 19.

* * * * *